United States Patent [19]

Eccles et al.

[11] Patent Number: 4,869,998
[45] Date of Patent: Sep. 26, 1989

[54] INTERGRATED CIRCUIT SUBSTRATES

[75] Inventors: Edward S. Eccles, Bishop's Cleeve; James C. Green, Teddington, both of England

[73] Assignee: Smiths Industries Public Limited Company, London, England

[21] Appl. No.: 44,258

[22] Filed: Apr. 30, 1987

[30] Foreign Application Priority Data

May 1, 1986 [GB] United Kingdom ............... 86 10655

[51] Int. Cl.$^4$ ............................................. G03C 5/00
[52] U.S. Cl. ....................................... 430/311; 430/5; 430/22; 430/394; 437/229; 355/53
[58] Field of Search ................... 430/5, 22, 311, 394; 355/53, 54; 437/229

[56] References Cited

U.S. PATENT DOCUMENTS

| | | | |
|---|---|---|---|
| 3,716,296 | 2/1973 | Springer et al. | 355/53 |
| 4,343,877 | 8/1982 | Chiang | 430/5 |
| 4,442,188 | 4/1984 | Chiang | 430/5 |
| 4,488,806 | 12/1984 | Takahashi et al. | 355/77 |
| 4,577,958 | 3/1986 | Phillips | 355/43 |
| 4,610,940 | 9/1986 | Araihara | 430/5 |
| 4,702,592 | 10/1987 | Geiger et al. | 355/53 |

FOREIGN PATENT DOCUMENTS

| | | | |
|---|---|---|---|
| 0138639 | 4/1985 | European Pat. Off. | |
| 12644 | 2/1981 | Japan | 430/5 |
| 187252 | 8/1986 | Japan | 430/5 |
| 1156840 | 7/1969 | United Kingdom | |
| 1259537 | 1/1972 | United Kingdom | |

*Primary Examiner*—Jose G. Dees
*Attorney, Agent, or Firm*—Pollock, Vande Sande & Priddy

[57] ABSTRACT

An integrated circuit substrate is made by exposing a mask to a composite representation of the pattern of integration of several different dice. The mask is exposed several times to produce several composite representations on the mask. Several different composite representations may be formed on the same mask. Identical aligned composite representations are checked by optically comparing corresponding dice in different composite representations via respective optical systems. The several composite representations on the mask are transferred simultaneously to the substrate to reproduce the pattern of integration of the dice at a plurality of locations in the substrate. The area of the mask covered by the composite representations may be greater than the usable area of the substrate such that for at least two of the composite representations only a portion of the composite representations is reproduced on the substrate, some of those dice not reproduced in one of the composite representations being reproduced in the other of the two composite representations. One half of the mask may have composite representations relating to one processing step, while the other half of the mask relates to a different processing step, the mask being reoriented after the first step so that the part of the substrate exposed initially to the one half of the mask is subsequently exposed to the other half of the mask, the other part of the substrate being rejected.

9 Claims, 5 Drawing Sheets

INTERGRATED CIRCUIT SUBSTRATES

BACKGROUND OF THE INVENTION

This invention relates to integrated circuit substrates and masks.

Integrated circuits are made by selectively diffusing or implanting dopants into areas on the surface of a semi-conductor material, such as silicon, so as to modify the conductivity of the doped areas. Layers of insulating material, such as silicon oxide, and conducting material, such as aluminium, are then successively deposited on the surface to insulate and interconnect different areas. At each step in the manufacturing process, the areas into which the dopants and surface layers are introduced are defined by means of a resist coating. Selected areas of the resist coating are exposed to electromagnetic radiation and then developed, or washed, to leave either the areas of exposed or unexposed resist, depending on the type of resist. These remaining areas of resist mask the underlying areas of the substrate during the doping or other process, so that only those areas of the substrate exposed through windows in the resist layer will be doped or otherwise treated.

The resist layer can be exposed to radiation in one of two different ways. One method uses an electron beam which is focussed to a small spot on the wafer and raster scanned across it, being modulated on or off as it does this so as to expose the appropriate areas. The other, more commonly used method employs a mask bearing the desired pattern which is placed over the resist layer. Electromagnetic radiation such as ultra-violet radiation is used to illuminate the mask so that only those regions of the resist under transparent areas of the mask are exposed to radiation. The mask is subsequently removed and can be reused.

The typical integrated circuit is much smaller than the semiconductor substrate which is in the form of a circular wafer of diameter between about 50 mm and 100 mm. The circuit formed on the substrate is in the form of a rectangular die, each substrate generally holding several hundred dice arranged in parallel rows across the substrate, although, depending on the size of the dice and wafer this number may be between about thirty and several thousand.

The material costs involved in manufacture of such circuits is relatively low, the major manufacturing costs arising from the preparation of the mask. This is prepared by optically transferring a pattern of integration drawn to a large scale on paper, at a reduced scale, to a mask in the form of a transparent plate having a photographic emulsion layer. In order to keep manufacturing costs down, this optical transfer process is repeated by stepping the mask across its width in parallel rows to expose adjacent areas of the mask to an identical pattern of integration. In this way, all the dice in any one substrate will be identical. It will be appreciated that if different dice are to be mixed on one mask, this will considerably add to the cost of producing the mask, since it will be necessary to change repeatedly the pattern to which the mask is exposed during manufacture. The cost and difficulties of doing this are so great that it is generally preferable to prepare separate masks for each different die even though this may lead to considerable waste when only small numbers of one die are required. As a compromise, masks have been produced in which one or more rows of dice have a different configuration of dice from the dice in the other rows, although each die in any row is identical. Even this, however, requires added complication to the mask manufacturing process leading to additional costs. Furthermore, where only small numbers of any one type of die is required there will still either be considerable waste, if each substrate only has a small number of different dice, or excessive costs if there are a larger number of rows each with a different die.

Because each substrate is subjected to a number of different processing steps during manufacture, each of which require the substrate to be exposed to different patterns for doping, insulation, interconnection and so on, each of these processes requires a different mask dedicated to that process. This contributes to the cost of manufacture of the integrated circuits, being especially significant where only small numbers of circuits are required.

It is an object of the present invention to enable a reduction in these manufacturing costs especially in small quantity production.

According to one aspect of the present invention there is provided a method of manufacture of an integrated circuit substrate comprising a plurality of different independent circuit dice, each die being repeated a plurality of times over the substrate, a representation of the pattern of integration of the different dice being produced as a composite representation of a plurality of dice, the composite representation being transferred to a mask repeatedly to reproduce the composite representation and each die in a different region of the mask on each transfer, and the plurality of composite representations on the mask being transferred to the substrate simultaneously such as to reproduce the pattern of integration of the dice at a plurality of locations in the substrate.

In this way, a mask can be produced having several different dice without increasing its cost, since it is only necessary to transfer the same composite representation to the mask.

According to another aspect of the present invention there is provided a method of manufacture of a mask for use in the manufacture of an integrated circuit substrate of the kind comprising a plurality of different independent circuit dice, each die being repeated a plurality of times over the substrate, a representation of the pattern of integration of different dice being produced as a composite representation of a plurality of dice, and the composite representation being transferred to the mask repeatedly to reproduce the composite representation and each die in a different region of the mask on each transfer, so that the plurality of composite representations can be transferred simultaneously to the substrate by imaging the mask on the substrate.

The composite representations on the mask may be transferred to the substrate by passing radiation through the mask to expose a layer of resist on the substrate.

The area of the mask covered by the composite representations may be greater than the usable area of the substrate such that for at least two of the composite representation at least one of their respective dice is not fully reproduced on the substrate, at least one of those of the dice not fully reproduced on the substrate in the other of the two composite representations. The method may include the steps of selecting those of the dice fully reproduced on the substrate and rejecting those of the dice not fully reproduced on the substrate.

The mask may have two regions over its area associated with respective different processing steps, the pattern of integration in both the regions being transferred simultaneously to respective areas of the substrate, the substrate being subsequently subjected to one of the different processing steps associated with one of the regions, and the mask or an identical mask being used to transfer the pattern of integration in the other of the regions to a substrate which is subsequently subjected to the other of the processing steps. The mask or an identical mask may be used to transfer the pattern of integration in the other of the said regions to the same substrate. The mask or an identical mask may be rotated relative to the substrate after the one processing step and prior to the other of the processing steps.

One region of the mask may have a pattern of integration associated with a processing step for one substrate, another region of the mask having a pattern of integration associated with a processing step for a different substrate, and the mask or an identical mask being used to transfer both said patterns of integration to the two different substrates.

Reproductions of identical composite representations on the mask are preferably aligned with one another, and corresponding dice in aligned identical composite representations are optically compared via respective optical systems.

According to a further aspect of the present invention there is provided a substrate made by the above one aspect of the present invention. According to yet another aspect of the present invention there is provided a mask made by the above other aspect of the present invention.

Some at least of the composite representations may be rectangular or square in shape. Some of the composite representations may differ from others of the composite representation.

The mask may include a first group of composite representations comprising two rows of three composite representations each, a second group of three composite representations different from the composite representations of the first group arranged as a third row adjacent one of the said two rows, the size of the mask relative to the substrate being such that all the composite representations in the central row of the three rows, in the first group, will be fully reproduced on the substrate, that one composite representation in the other row of the first group and in the second group will be fully reproduced, and that two composite representations in the other row of the first group and in the second group are partially reproduced, with those dice reproduced from the two partially reproduced composite representations together forming one complete composite representation in each group.

The mask may have three identical copies of each die in each composite representation of the second group. Some at least of the composite representations may be of a different size from others of the composite representations. Some of the dice in the composite representations may be identical with other dice in the same composite representation.

Alternatively, all the dice in the composite representations may be different from other dice in the same composite representation.

Some at least of the dice in the composite representations may differ in size from others of the dice in the same composite representations.

The dice preferably have alignment marks thereon. The dice may have contact pads arranged around their edges, the contact pads being arranged at identical locations on different dice. The dice may be electrically encoded.

Methods of manufacturing integrated circuit substrates and masks used in their manufacture in accordance with the present invention, will now be described, by way of example, with reference to the accompanying drawings.

DETAILED DESCRIPTION

The method described below is for producing nine different dice on one integrated circuit substrate.

The mask 1 for the first processing step in the manufacture of the substrate is produced in the following way.

Figure 1:
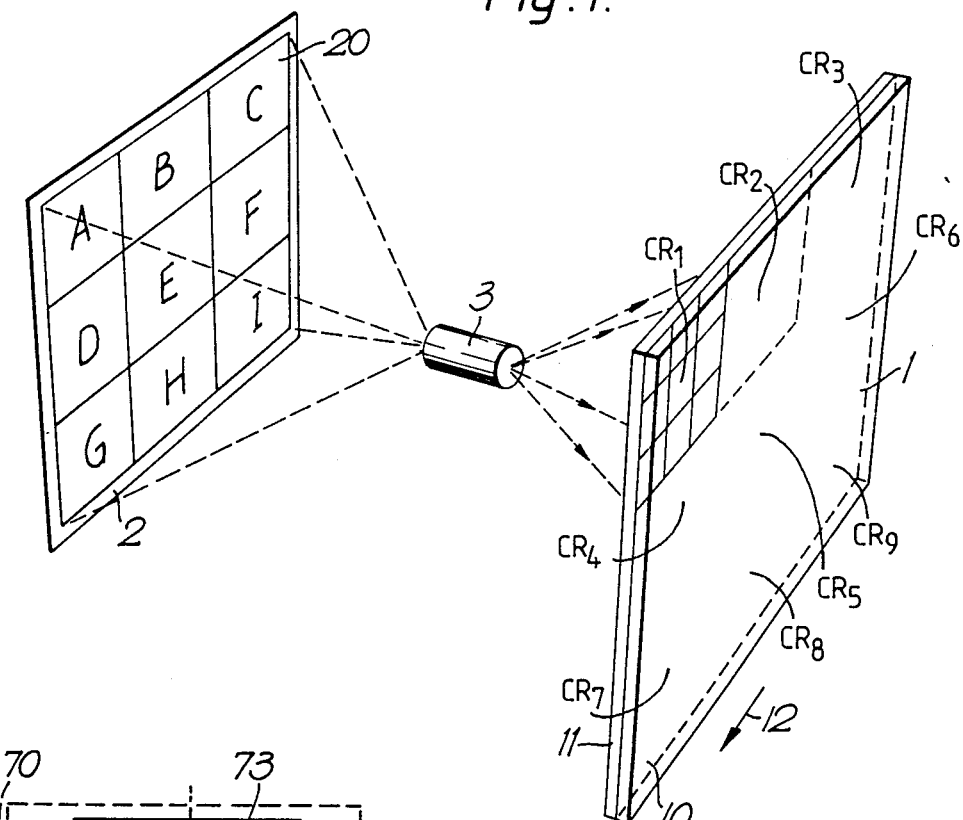
FIG. 1 is a perspective view illustrating schematically the preparation of a mask.

As shown in FIG. 1, the pattern of integration for the first processing step for each of the nine dice A to I is drawn on a surface 2 as a composite representation 20. The pattern for each die is of rectangular shape and they are arranged side-by-side in three rows A to C, D to F and G to I. Each die is completely independent of the others of the dice and has a different pattern of integration. The pattern on the surface 2 is on a considerably larger scale than the actual circuits to be manufactured.

The surface 2 is illuminated by suitable radiation and an image of the composite representation 20 is focused by means of a reducing lens system 3 onto one corner of the mask 1. The image formed on the mask 1 is smaller than the pattern on the surface 2, being the same size as that of the dice to be made. At this stage, the mask 1 takes the form of a transparent plate 10 coated on the surface facing the lens system 3 with a high-definition chrome photographic emulsion 11 which is exposed by radiation imaged on it by the lens system 3. When this region of the mask 1 has been exposed for the desired time, the illumination is removed and the mask 1 is displaced laterally as shown by the arrow 12 by a distance equal to the width of the first exposed image of the composite representation. An image of the composite representation 20 is then focussed on a second region of the mask adjacent the first exposed region, as shown by the broken lines in FIG. 1. This exposure process is then repeated by stepping the mask along and up to produce, in all, nine identical exposures of the composite representation $CR_1$ to $CR_9$ side-by-side in three rows. It will be seen therefore that the mask carries the image of eighty-one dice patterns, that is nine copies of each pattern A to I.

The exposed mask is developed in the usual way to fix the images on the mask as transparent and opaque regions.

Figure 2:
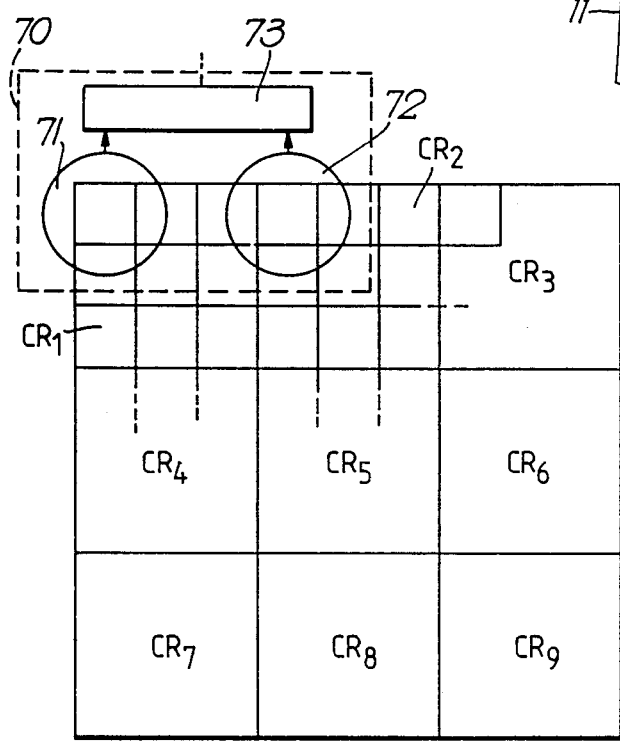
FIG. 2 is a plan view representing schematically how the mask can be checked.

The mask is then optically checked using a conventional optical checking device 70 as shown schematically in FIG. 2. This device 70 has two separate optical systems 71 and 72 which are located to view simultaneously respective nominally—identical regions of different composite representations. The images produced by each optical system 71 and 72 are compared in a photo-electric comparator 73 to identify any difference between the respective regions and produce an output signal accordingly. The output may be used to reject the mask or to correct it, such as by directing a laser evaporator to remove selectively unwanted regions. The nominally-identical dice, will be separated from one another by the width of the composite representations, this separation making it possible to compare dice of adjacent composite representations. The minimum separation between the two optical systems 71 and 72 in the optical checking device 70 would normally prevent adjacent dice in a row comprising only one type of dice being checked with one another.

Figure 3:
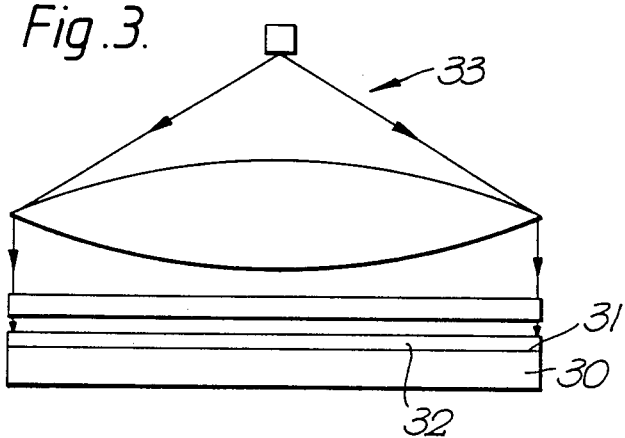
FIG. 3 is a side elevation view showing a step in manufacture of the substrate.
Figure 4:
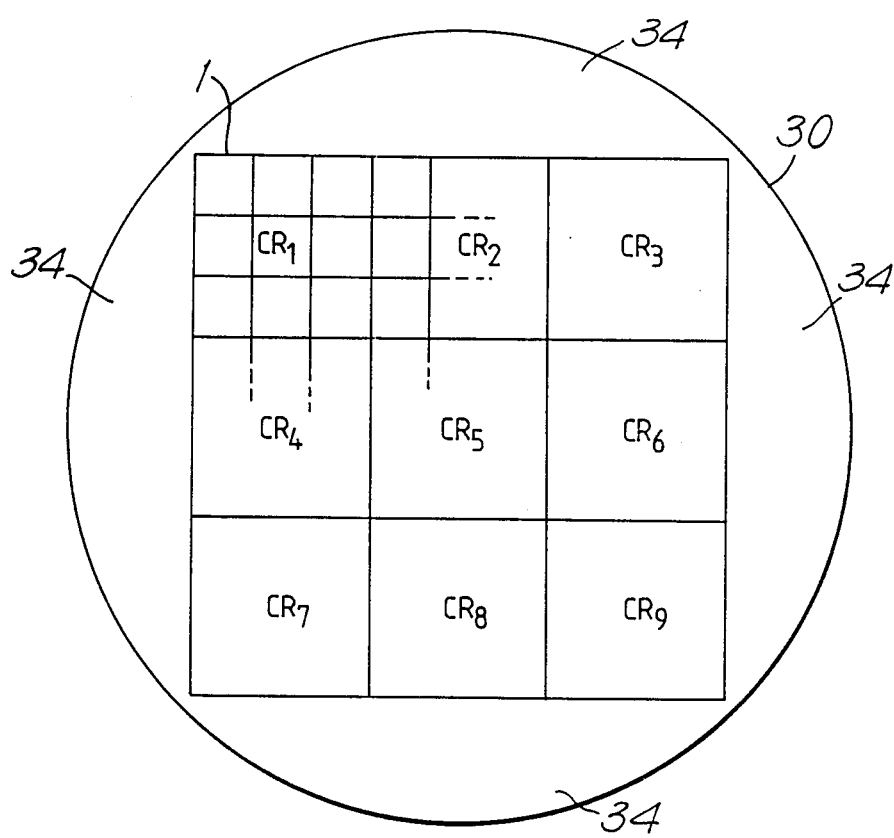
FIG. 4 is a plan view of the step shown in FIG. 3.

The completed mask 1 is used to transfer the patterns of integration to a semiconductor substrate 30, as shown in a simplified form in FIGS. 3 and 4. The upper surface 31 of the substrate 30 is first coated with a layer 32 of resist material. The mask 1 is mounted above the substrate 30 and is illuminated by a radiation source 33 so as to expose those regions of the resist layer 32 which underlie transparent regions of the mask. The mask 1 can be placed in contact with the resist layer 32 or be illuminated by collimated radiation, so that the size of the image transferred to the resist layer 32 is identical to that of the mask. It will be appreciated, however, that various optical systems could be used to produce an enlarged or reduced image of the mask on the substrate 30.

After exposure through the mask 1, the resist layer 32 is developed in the usual way to remove selectively either the exposed or unexposed areas of resist according to the nature of the resist.

The next step is to subject the substrate to a conventional doping process by which dopant is diffused into those regions of the substrate exposed through windows in the resist layer 32.

After this has been carried out, the substrate is treated to subsequent processes which may require the use of further resist layers each of which is exposed to radiation through other masks having different patterns of integration, but each of which comprises a plurality of composite representations identical with one another. These subsequent processes may be of conventional kinds to build up the integrated circuit of each die. When manufacture of the substrate is completed it will comprise nine copies of each of the nine different dice. These can be tested, cut and mounted in die carriers in the usual way.

In this way, it is possible to produce a mask for manufacturing a substrate which has several different dice, but which can be made by repeated exposure to the same image, that is, an image of a composite representation of all the different dice.

It will be appreciated that each composite representation may include any number of two or more dice and that the composite representation may be transferred to the mask at any number of two or more different locations.

In FIG. 4, the pattern of the nine composite representations $CR_1$–$CR_9$ on the mask 1 is shown as falling entirely within the periphery of the underlying substrate 30 so that each die pattern represented on the mask produces a usable die on the substrate. This, however, does not necessarily give the most economic use of the available area of the substrate since it will be seen that it results in four segments 34 on the substrate which fall outside the area of the composite representations imaged on the substrate.

Figure 5:
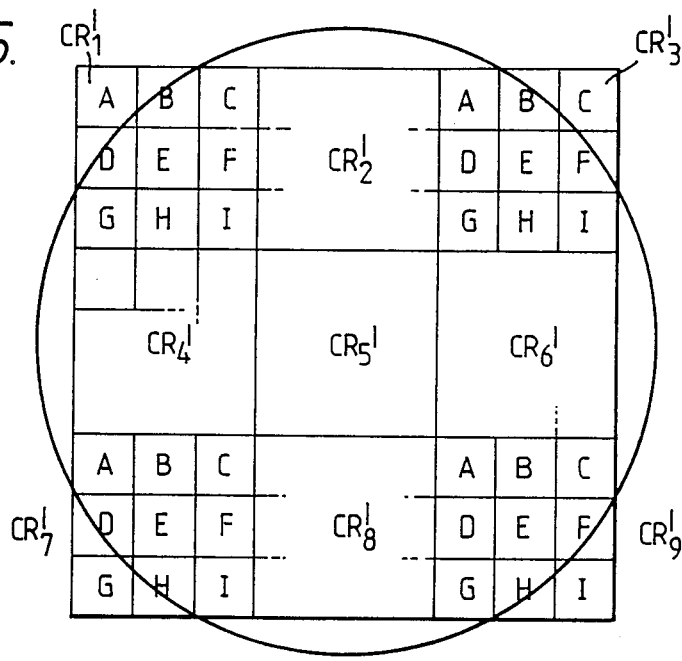
FIGS. 5 to 10 are plan views illustrating different configurations of mask and substrate.

A more economic arrangement may be produced by the arrangement shown in FIG. 5. In this, the area of the composite representations $CR_1'$ to $CR_9'$ imaged on the substrate 30' is greater than the usable area of the substrate. In the layout shown in FIG. 5, this results in a part of each of four of the composite representations $CR_1'$, $CR_3'$, $CR_7'$, and $CR_9'$ falling outside the substrate 30'. Some of the dice in each of these composite representations will not therefore be fully reproduced on the substrate and will therefore not be usable. However, it can usually be arranged that those dice not reproduced on the substrate by one composite representation are reproduced by another composite representation. In the arrangement in FIG. 5, those composite representations not fully reproduced on the substrate do, however, reproduce in full the following dice:

$CR_1'$: C, E, F, G, H, I
$CR_3'$: A, D, E, G, H, I
$CR_7'$: A, B, C, E, F, I
$CR_9'$: A, B, C, D, E, G

These four composite representations therefore reproduce a total number of each die as follows:

A—3
B—2
C—3
D—2
E—4
F—2
G—3
H—2
I—3

Such a layout can, therefore, enable a greater number of dice to be obtained from a substrate in some circumstances.

For some applications it may be desired to produce more copies of one die than another die. This can be achieved by using a mask having a composite representation in which that one die is duplicated in the composite representation more than once, so that more than one copy of the die is produced from each composite representation on the substrate.

Figure 6:
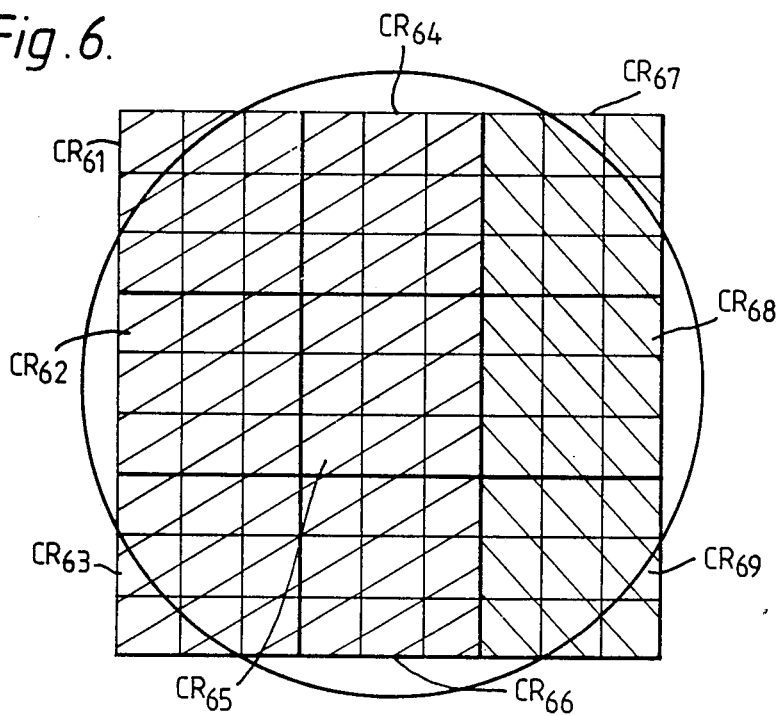

A greater variety of different dice can be produced by reproducing two or more different composite representations on the same substrate. This, of course, adds to the cost of the final circuits, but is considerably cheaper than duplicating each different die in turn on the mask. The different composite representations are arranged in rows on the mask for ease of production, as shown in FIG. 6. In this arrangement the composite representations are arranged in three vertical rows, the representations $CR_{61}$ to $CR_{66}$ form a first group of two vertical rows identical with one another, whereas the three representations $CR_{67}$ to $CR_{69}$ form a second group of representations in the third row, which are different from the first group, but identical with one another. If each composite representation comprises nine different dice then it will be seen that by using two different composite representations it is possible to have eighteen different dice while only changing once the pattern to which the mask is exposed.

Figure 7:
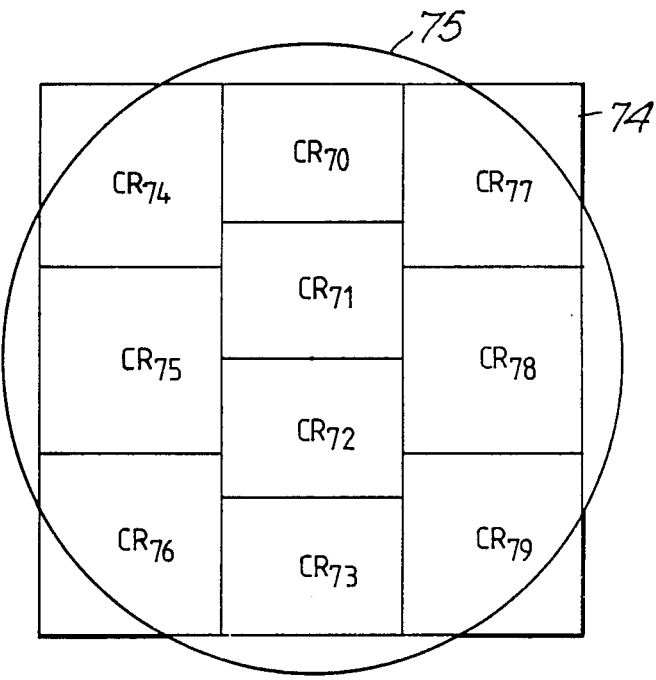

In practice, because of various factors such as uncorrected mask defects, defects in the silicon substrate and defects caused during processing, not every die on the substrate will be usable. A typical yield would be one usable die for every three to six die on the substrate. In order to ensure that the substrate produces at least one usable die it is desirable for each die to be replicated about five times on the substrate. The configuration shown in FIG. 6 lends itself to a five times replication. It will be seen that if each die in the composite representations $CR_{61}$ to $CR_{66}$ of the first group are different this will result in five copies of each die, since the partly reproduced representations $CR_{67}$ and $CR_{69}$ combine together to produce one complete composite representation. In the second group of composite representations $CR_{67}$ to $CR_{69}$, the partly reproduced representations $CR_{67}$ and $CR_{69}$ together produce one complete composite representation, making two composite representations in total for the second group. If each die in the representations $CR_{67}$ to $CR_{69}$ is replicated three times within each composite representation then this results in six copies of each die in the second group which gives the desired yield for each die on the substrate with a minimum of waste.

Where different composite representations are used they need not be of the same size or shape as each other. With reference to FIG. 7, there is shown a mask having two different composite representations of different sizes. The smaller of the composite representations $CR_{70}$ to $CR_{73}$ are arranged as a central vertical row of four representations which lie wholly within the substrate 75. The larger of the composite representation $CR_{74}$ to $CR_{79}$ are arranged in two other vertical rows each of three units $CR_{74}$ to $CR_{76}$ and $CR_{77}$ to $CR_{79}$ respectively. The height of the outer rows are the same as the central row, the size of the larger representations being such that only $CR_{75}$ and $CR_{78}$ fall fully within the boundary of the substrate 75. However, by combining those dice within $CR_{74}$ and $CR_{79}$ that are reproduced on the substrate, and those from $CR_{76}$ and $CR_{77}$ it is possible to obtain the equivalent of two further composite representations. This arrangement thereby produces four of the small composite representations and four of the larger composite representations.

Figure 8:
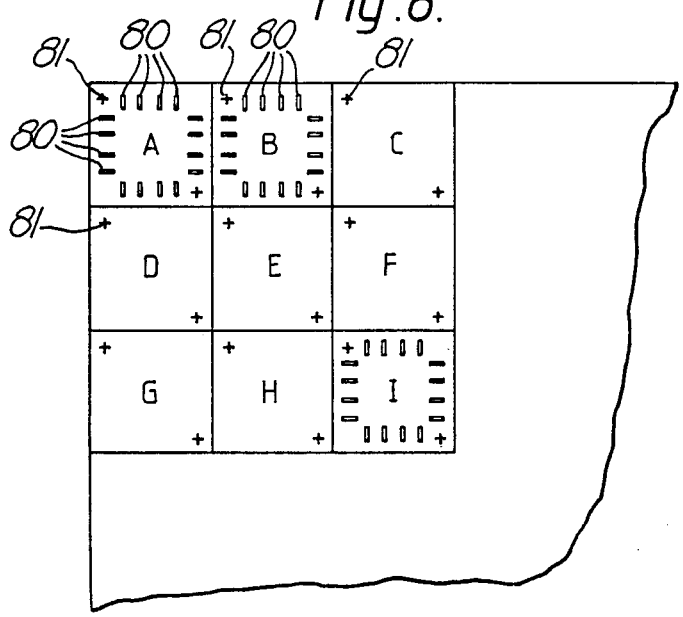

To facilitate subsequent wiring of the dice into their respective carriers, it is preferable if each of the different dice has contact pads 80 disposed around its edges in identical locations, as shown in FIG. 8. This makes it possible for different dice to be assembled into their carriers using an automated wiring machine without any need to reset it for each different die. Preferably the pattern of integration for each die on each of the different masks has one or more alignment marks which is shown in FIG. 8 as taking the form of a cross 81 in two opposite corners of each die. This enables accurate location of each mask for subsequent processes during manufacture.

After cutting the substrate to separate the individual dice from one another prior to assembly into the respective carriers, there is a risk that the different dice produced from one substrate will become mixed with each other. It is advisable, therefore, for the dice to be marked in some way to facilitate identification and sorting. This may be done in many different ways, but is preferably in a way that enables machine identification. In particular, the circuit on each die may include a circuit element or elements uniquely characteristic of that die which can be identified electronically. This may, for example, take the form of a shift register having stored within it an identification code for that die. The shift register may be read automatically during the assembly process; stages of the assembly process, such as wiring, may be varied automatically according to the nature of the die.

As mentioned above, the manufacture of an integrated circuit substrate requires the use of several different masks to produce the different resist patterns needed for each of the different processing steps, a typical circuit requiring twelve different masks. The cost of providing these masks adds to the cost of the finished circuit especially where only a small number of dice are required. The number of masks required can, however, be reduced in the manner described below.

Figure 9:
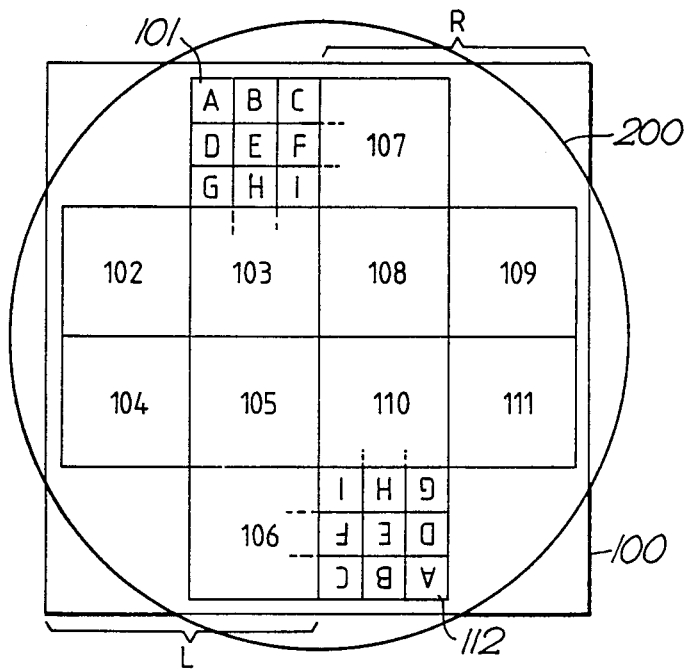
Figure 10:
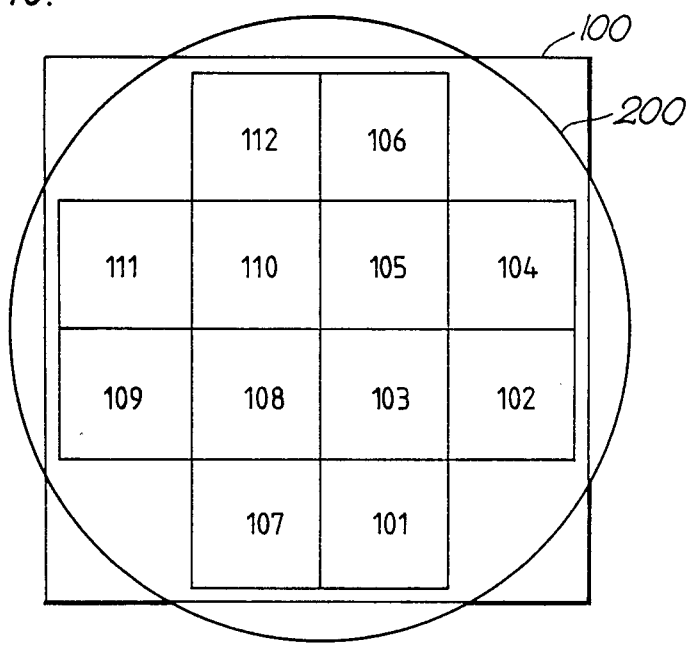

With reference to FIGS. 9 and 10, there is shown a mask 100 having a symmetrical pattern of twelve composite representations 101 to 112 of dice which fall within the edge of a semiconductor substrate 200 onto which the pattern is to be reproduced. The left-hand half of the pattern L, comprising the composite representations 101 to 106, relate to the patterns of the die needed for the first processing step, whereas the right-hand half of the pattern R, comprising the composite representations 107 to 112, relate to patterns of the die needed for the second processing step.

The entire pattern on the mask 100 is transferred to the resist layer on the substrate 200 which is developed in the usual way, the substrate then being subjected to the first processing step, such as dopant diffusion. Because the pattern reproduced on the right-hand part of the substrate relates to the second processing step rather than the first processing step, this part of the substrate will, in general, be useless after the first processing step. The left-hand part of the substrate will, however, have received the desired process.

The mask 100 is then rotated through 180 degrees, as shown in FIG. 10, so that those composite representations 107 to 112 relating to the second processing step, which were originally on the right-hand of the mask, are now on the left-hand. The composite representations 112, 111, 110, 109, 108, and 107 thereby overlie the locations of the representations 101, 102, 103, 104, 105, and 106 respectively. After recoating the substrate 200 with another layer of resist it can be exposed through the rotated mask 100 so that the pattern of integration for the second process is transferred to those composite representations on the left-hand of the substrate. It will be appreciated that the composite representations relating to the second process will have to be reproduced in an inverted form relative to those composite representations relating to the first process. During the transfer of the pattern for the second process, the right-hand part of the substrate will have transferred to it a pattern for the first process.

This enables one mask to be used for two different processes although it does result in half the substrate being wasted. When, however, only small quantities of dice are required this may not be important.

The same mask could carry patterns of integration for more than two processes, although the larger the number of processes, the greater the wastage.

It will be appreciated that the mask need not be rotated to reposition it for transfer of the pattern for the second process, but could be, for example, laterally displaced or inverted back-to-front.

Instead of using the same mask for the second process it may in some circumstances be more convenient to use a different, but identical mask.

Instead of using one mask for reproducing patterns for different processes on one substrate, the mask may instead, for example have one region relating to one process for one substrate and another region relating to one process for a different substrate.

All these different arrangements can be used to reduce the cost of preparing masks.

What we claim is:

1. A method of manufacture of an integrated circuit substrate comprising a plurality of different independent circuit dice, each die being repeated a plurality of times over the substrate, comprising the steps of: producing a representation of the pattern of integration of the different dice as a composite representation of a plurality of dice; forming a first image of the plurality of dice of said composite representation in a first region of the mask so as to expose photographic resist on the mask and reproduce said composite representation in said first region; subsequently forming a second image of the dice of said composite representation in a second region, and optionally further regions, of the mask to expose photographic resist on the mask and reproduce said composite representation in said second region and optionally said further regions; and photographically transferring the plurality of composite representations on the mask to the substrate simultaneously such as to reproduce the pattern of integration of the dice at a plurality of locations in the substrate.

2. A method according to claim 1, wherein the area of the mask covered by the composite representations is greater than the usable area of the substrate such that for at least two of the composite representations at least one of their respective dice is not fully reproduced on the substrate, and wherein at least one of those of the dice not fully reproduced on the substrate in one of the composite representations is fully reproduced on the substrate in the other of the two composite representations.

3. A method according to claim 1, wherein the mask has two regions over its area associated with respective different processing steps, wherein the pattern of integration in both the regions is photographically transferred simultaneously to respective areas of the substrate, wherein the substrate is subsequently subjected to one of the different processing steps associated with one of the regions, and wherein the mask or an identical mask is used to photographically transfer the pattern of integration in the other of the regions to a substrate which is subsequently subjected to the other of the processing steps.

4. A method according to claim 3, wherein the mask or an identical mask is used to photographically transfer the pattern of integration in the other of the said regions to the same substrate.

5. A method according to claim 3, wherein one region of the mask has a pattern of integration associated with a processing step for one substrate, wherein another region of the mask has a pattern of integration associated with a processing steps for a different substrate, and wherein the mask or an identical mask is used to photographically transfer both said patterns of integration to the two different substrates.

6. A method according to claim 1, wherein reproductions of identical composite representations on the mask are aligned with one another, and wherein corresponding dice in aligned identical composite representations are optically compared via respective optical systems.

7. A method according to claim 1, wherein some of the composite representations differ from others of the composite representations.

8. A method according to claim 7, wherein the mask includes a first group of composite representations comprising two rows of three composite representations each, a second group of three composite representations different from the composite representations of the said first group, said second group being arranged as a third row adjacent one of the said two rows, wherein the size of the mask relative to the substrate is such that all the composite representations in the central row of the three rows, in the first group, are fully reproduced on the substrate, that one composite representation in the other row of the first group and in the second group is fully reproduced, and that two composite representations in the other row of the first group and in the second group are partially reproduced, with those dice reproduced from the two partially reproduced composite representations together forming one complete composite representation in each group.

9. A method according to claim 1, wherein each die is electrically encoded to identify the die.

* * * * *